(12) United States Patent
Grave et al.

(10) Patent No.: US 11,334,101 B2
(45) Date of Patent: May 17, 2022

(54) CIRCUITS AND METHODS PROVIDING BANDGAP CALIBRATION FOR MULTIPLE OUTPUTS

(71) Applicant: QUALCOMM Incorporated, San Diego, CA (US)

(72) Inventors: Baptiste Grave, Douglas (IE); Mustafa Keskin, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 396 days.

(21) Appl. No.: 16/720,333

(22) Filed: Dec. 19, 2019

(65) Prior Publication Data

US 2021/0191437 A1 Jun. 24, 2021

(51) Int. Cl.
| | |
|---|---|
| *G05F 1/56* | (2006.01) |
| *G05F 1/565* | (2006.01) |
| *H03M 1/34* | (2006.01) |
| *G05F 3/30* | (2006.01) |

(52) U.S. Cl.
CPC .............. *G05F 1/565* (2013.01); *H03M 1/34* (2013.01); *G05F 3/30* (2013.01)

(58) Field of Classification Search
CPC ............. G05F 1/565; G05F 3/30; H03M 1/34
See application file for complete search history.

(56) References Cited

U.S. PATENT DOCUMENTS

| | | |
|---|---|---|
| 10,663,994 B2 | 5/2020 | Lin |
| 10,677,664 B1 | 6/2020 | Wong et al. |
| 10,892,767 B1 * | 1/2021 | Chen ..................... H03M 1/066 |
| 10,915,298 B1 * | 2/2021 | Far ........................ G06F 7/5443 |
| 10,983,546 B1 | 4/2021 | Grave |
| 2008/0191794 A1 | 8/2008 | Chiu et al. |
| 2014/0145701 A1 | 5/2014 | Temkine et al. |
| 2020/0249096 A1 * | 8/2020 | Tao ........................ G01K 7/015 |

* cited by examiner

*Primary Examiner* — Kyle J Moody
*Assistant Examiner* — Lakaisha Jackson
(74) *Attorney, Agent, or Firm* — Haynes and Boone, LLP

(57) ABSTRACT

A method and an apparatus to provide bandgap calibration for multiple outputs are disclosed. In one implementation, a computing chip includes a bandgap current generator; a first adjustable current output coupled to the bandgap current generator; a second adjustable current output coupled to the bandgap current generator; a first switch selectively coupling the first adjustable current output to a calibration circuit and to a first analog-to-digital converter (ADC); and a second switch selectively coupling the second adjustable current output to a load on the computing chip and to the ADC.

27 Claims, 8 Drawing Sheets

| Case | S0 | S1 | S2 | S3 | S4 | Ip-calibrated | Current Source | Load | $R_0$ | ADC | Measure |
|---|---|---|---|---|---|---|---|---|---|---|---|
| 1.a. | Off | On | Off | Off | Off | Off | On | Off | Off | On | Current |
| 1.b. | On | Off | Off | Off | On | On | Off | Off | Off | On | $Current_{REF}$ |
| 2 | Off | On | On | Off | Off | Off | On | On | Off | On | Voltage |
| 3 | Off | Off | Off | Off | On | Off | Off | Off | On | On | $R_0$ impedance |
| 4 | Off | Off | On | Off | Off | Off | On | On | Off | Off | Active Mode |
| 5.a. | Off | On | Off | Off | On | Off | On | Off | On | On | Voltage on $R_0$ |
| 5.b. | On | Off | Off | Off | On | On | Off | Off | On | On | $Voltage_{REF}$ in $R_0$ |
| 6 | Off | Off | Off | On | Off | Off | Off | On | Off | On | Load impedance |

FIG. 6

CIRCUITS AND METHODS PROVIDING BANDGAP CALIBRATION FOR MULTIPLE OUTPUTS

CROSS REFERENCE TO RELATED PATENT APPLICATION

This application is related to U.S. patent application entitled, "Circuits and Methods Providing Bandgap Calibration," filed on even date herewith and herein incorporated by reference in its entirety.

TECHNICAL FIELD

The present application relates, generally, to calibration of on-chip components and, more specifically, to calibration of bandgap reference generators.

BACKGROUND

Some systems use bandgap generators to generate either a current or voltage (or both) which is used as a reference for various components and is expected to be the same across temperature and power supply voltages. Since the bandgap generators produce reference currents and voltages, it may be desirable to calibrate bandgap generators so that the output of the band gap generators precisely matches desired target.

One example uses a bandgap generator having multiple adjustable outputs. The outputs are all designed to be the same. Calibration may include calibrating a first one of the adjustable outputs by determining a calibration code that matches a target current and then applying that same calibration code to each of the adjustable outputs.

However, process variation and mismatch may cause the adjustable outputs to differ physically from each other. For instance, the adjustable outputs may include transistors, and process variation and mismatch within a chip may cause some of those transistors to be slightly different than others. Variation in the transistors may cause some of the adjustable outputs to have a higher output current or a lower output current compared to the target current.

In the example of FIG. 8, the calibration is performed by an external automated test equipment (ATE) 801, which couples to an output pin of the chip 803 and, through the output pin 802, to the first adjustable output. Lack of external connection to the other adjustable outputs may prevent using the ATE 801 to calibrate each of the adjustable outputs individually. And even if each of the adjustable outputs were coupled to an output pin, the expense of calibrating more than one bandgap generator per chip by the ATE might be cost-prohibitive.

Accordingly, there is a need in the art to for more reliable and precise calibration for bandgap generators having multiple outputs while not increasing ATE costs.

SUMMARY

Various implementations are directed to circuits and methods that calibrate bandgap current or voltage while not increasing ATE costs. One example system calibrates a first adjustable output of a bandgap generator using an external ATE. Once the first adjustable output is calibrated, then it can be used to calibrate the other adjustable outputs. Switches selectively couple the other adjustable outputs to either their respective loads or to an on-chip analog-to-digital converter (ADC) for measurement. The switches may be adjusted so that each adjustable output is calibrated against the first adjustable output using the ADC. The switches may then be readjusted to couple the adjustable outputs to their respective loads.

According to one implementation, a computing chip includes a bandgap current generator, a first adjustable current output coupled to the bandgap current generator, a second adjustable current output coupled to the bandgap current generator, a first switch configured to selectively couple the first adjustable current output to an external device and to a first analog-to-digital converter (ADC) on the computing chip, and a second switch configured to selectively couple the second adjustable current output to a load on the computing chip and to the ADC.

According to another implementation, a method includes calibrating a first adjustable output of a bandgap current generator, including setting the first adjustable output at a first current level, adjusting a first switch that is configured to selectively couple the first adjustable output to an analog-to-digital converter (ADC), providing current from the first adjustable output to the ADC, providing current from a second adjustable output of the bandgap current generator to the ADC, calibrating the second adjustable output, including setting the second adjustable output to the first current level, and adjusting a second switch that is configured to selectively couple the second adjustable output to a load and to the ADC.

According to another implementation, a system on chip (SOC) includes means for generating a plurality of reference current levels in response to a plurality of calibration codes, means for providing a first adjustable current from the generating means, means for providing a second adjustable current from the generating means, means for selectively coupling the first adjustable current to an external device and to a first analog-to-digital converter (ADC), on the SOC; and means for selectively coupling the second adjustable current to a load on the SOC and to the ADC.

According to yet another implementation, a system on chip (SOC) includes a bandgap current generator, a first digital-to-analog converter (DAC) coupled to the bandgap current generator, a second DAC coupled to the bandgap current generator; a first switch configured to selectively couple the first DAC to an external device and to a first analog-to-digital converter (ADC); and a second switch configured to selectively couple the second DAC to a load on the SOC and to the ADC.

BRIEF DESCRIPTION OF THE DRAWINGS

FIG. 6 is an illustration of example measurements that may be performed with the switching network of FIG. 5, according to one implementation.

DETAILED DESCRIPTION

Figure 1:
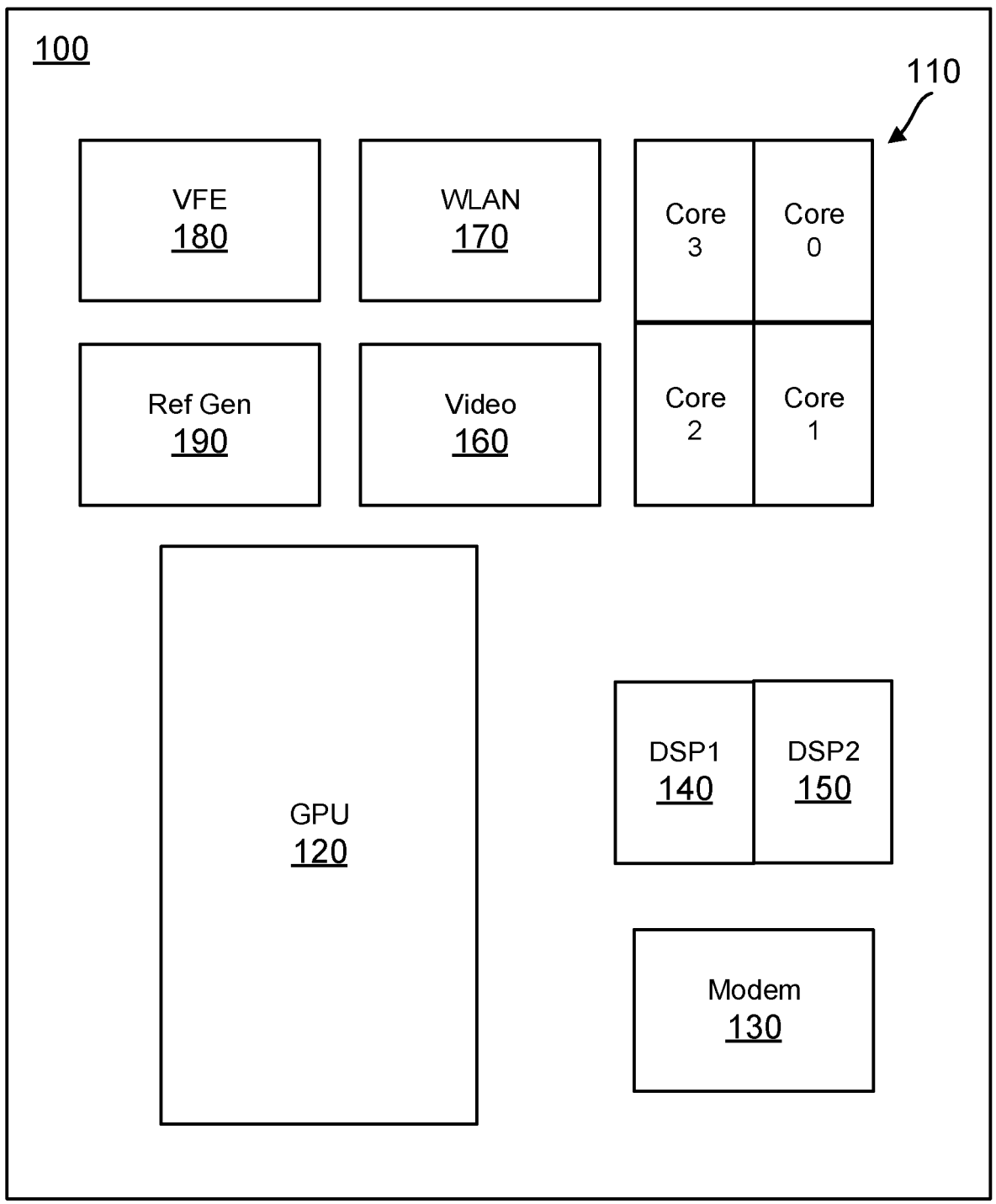
FIG. 1 is an illustration of an example computing device that may perform a method according to various implementations.

Various implementations provided herein include circuits and methods to calibrate bandgap generators using an in-line technique to measure multiple adjustable outputs.

An example implementation includes a bandgap generator coupled to a voltage supply (e.g., VCC). The bandgap generator provides output currents from a plurality of adjustable current outputs. For instance, each of the adjustable current outputs may include a current digital-to-analog converter (DAC). Each of the current DACs are adjustable by application of a calibration code, and each of the DACs may be adjusted individually by applying a respective calibration code.

Continuing with this example, a first one of the adjustable current outputs is coupled to a switch that selectively couples the first adjustable current output to either an external automated test equipment (ATE) or to an on-chip analog-to-digital converter (ADC). The switch may be used to couple the first adjustable current output to the ATE to calibrate the first adjustable current output. For instance, the ATE may measure the current level from the first adjustable current output, compare that current to a target current level, and generate a calibration code to cause the first adjustable current output to output current at the target current level. This first adjustable output may also be coupled to a restive load internally so that the ATE may measure the voltage on this load ($V_O$ in FIG. 2) instead of directly a current.

Further in this example, the system may include multiple other adjustable current outputs. The example system includes hardware and logic to perform an in-line calibration of those other, multiple adjustable current outputs so that their current levels match the current level from the calibrated adjustable output. To that end, each of the other, multiple adjustable current outputs is coupled to a switch, and each switch selectively couples its adjustable current output to either a load or the ADC.

During calibration, a given switch may be adjusted so that it couples its adjustable current output to the ADC. A switch associated with the calibrated adjustable current output couples the calibrated adjustable current output to the ADC as well. The ADC measures voltage or current from both of the outputs, and control circuitry within the chip calibrates the uncalibrated adjustable current output to match the calibrated adjustable current output. This process may be performed for each of the remaining adjustable current outputs so that each of the adjustable current outputs has an output current level that matches that of the calibrated current output.

As noted above, process variation and mismatch may result in some of the adjustable current outputs being physically different and therefore having slightly higher or slightly lower output current levels for a given calibration code. The technique described herein performs individual calibration of each of the adjustable current outputs so that process variation and mismatch may be countered by applying different calibration codes to different ones of the adjustable current outputs. Accordingly, two adjustable current outputs having a same output current level may have different calibration codes.

Once an adjustable current output has been calibrated, the control circuitry may adjust its switch so that the adjustable current output is coupled to its load. The switching process may be performed for each of the adjustable current outputs.

Various implementations may be performed by hardware and/or software in a computing device. For instance, some implementations include register transfer level (RTL) hardware for the logic circuit so that the logic is built into the chip and is relatively quick in operation. In other examples, the functionality of the logic circuit may be implemented using firmware and/or software that is executed by on-chip logic. Various implementations may further include non-volatile or volatile memory set aside in an integrated circuit chip in a computing device to store the set of available calibration codes or other appropriate information.

An advantage of some implementations described above is that they may provide increased precision for multiple current outputs of a bandgap generator without costing additional ATE time or adding output pins to the chip. In other words, process variation and mismatch between different ones of the current outputs may be compensated by the calibration process. As a result, applications receiving reference currents or voltages may receive a current or voltage that is more precisely tuned to a target current or voltage. Additionally, this precision may be achieved through use of a feedback loop on the chip, thereby costing no more ATE time than some traditional systems. Furthermore, since the feedback loop is on the chip, the other current outputs may be calibrated without adding output pins to the chip or routing the other current outputs to existing output pins.

FIG. 1 is an illustration of example SOC 100, according to one implementation. In this example, SOC 100 is implemented on a semiconductor die, and it includes multiple system components 110-190. Specifically, in this example, SOC 100 includes central processing unit (CPU) 110 that is a multi-core general purpose processor having four processor cores, core 0-core 3. Of course, the scope of implementations is not limited to any particular number of cores, as other implementations may include two cores, eight cores, or any other appropriate number of cores in the CPU 110. SOC 100 further includes other system components, such as a first digital signal processor (DSP) 140, a second DSP 150, a modem 130, graphics processing unit (GPU) 120, a video subsystem 160, a wireless local area network (WLAN) transceiver 170, and a video-front-end (VFE) subsystem 180.

SOC 100 also includes reference generator 190, which in this example includes a bandgap reference generator. Reference generator 190 supplies reference currents and reference voltages to different components on SOC 100. For instance, each of the different components 110-180 may include various subcomponents that use a reference voltage or reference current. Examples of subcomponents that may use a reference voltage or a reference current include low dropout (LDO) voltage regulators, ADCs, current mode logic (CML) buffers, phase locked loops (PLLs), delay locked loops (DLLs), amplifiers, filters, and various loads. Such subcomponents are not explicitly shown in FIG. 1, but it is understood that the SOC of FIG. 1 would be expected to include multiple subcomponents employing reference voltages or currents.

Reference generator 190 not only supplies reference currents and voltages to the components on the SOC, but it also performs a calibration as described in more detail below.

Figure 2:
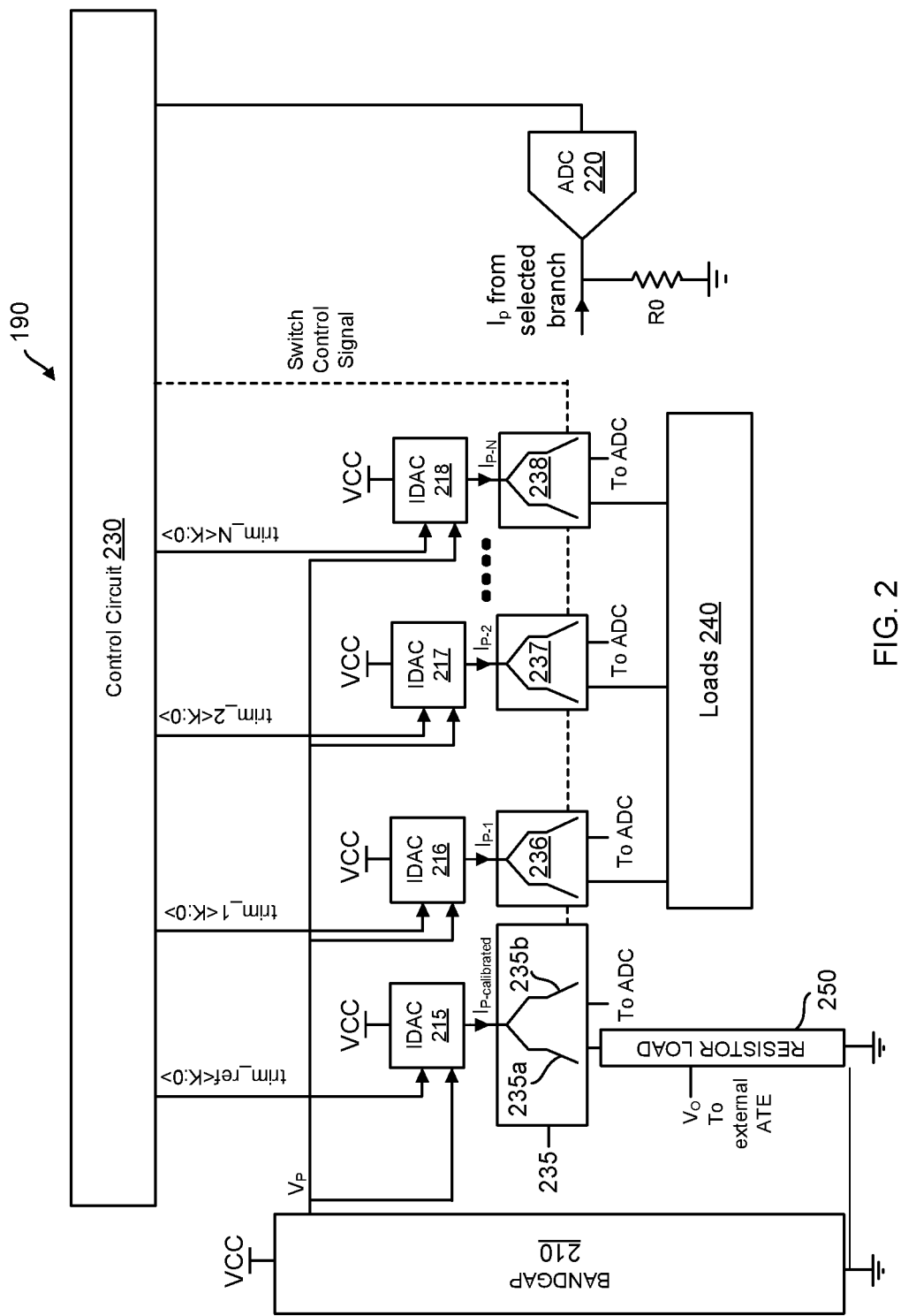
FIG. 2 is an illustration of an example reference generator of the computing device of FIG. 1, according to one implementation.
Figure 3:
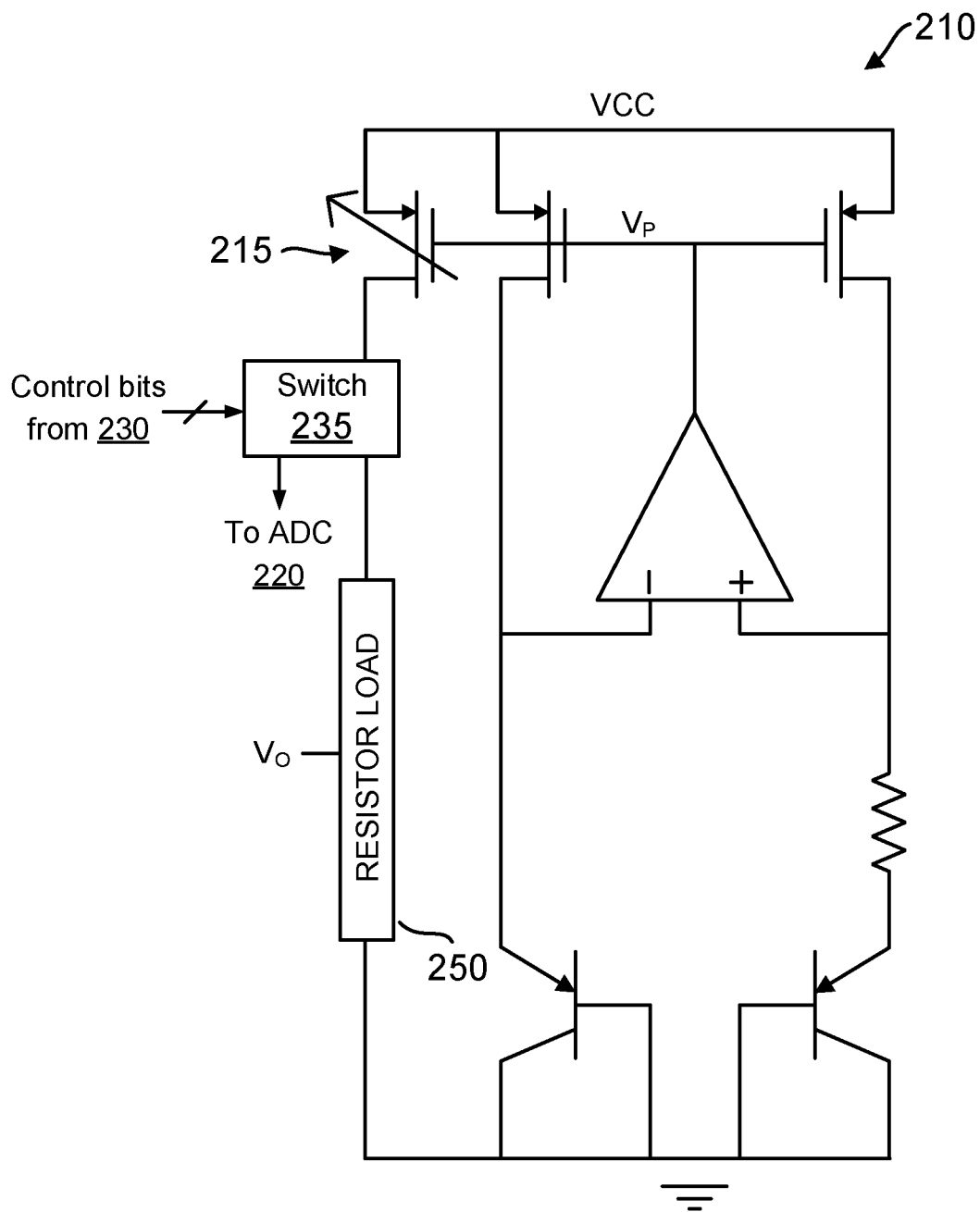
FIG. 3 is an illustration of an example bandgap generator that may be included in the computing device of FIG. 1 and the reference generator of FIG. 2, according to one implementation.

FIG. 2 illustrates an example reference generator 190 according to one implementation. Reference generator 190 includes a feedback loop to calibrate bandgap generator 210. Bandgap generator 210 may include any appropriate bandgap circuit architecture, an example of which is shown in FIG. 3. Bandgap generator 210 has a multiple reference current outputs, $I_{p-calibrated}$ and $I_{p-1}$ through $I_{p-N}$, where N can be any appropriate integer. The reference current output levels are determined by calibration codes, which are applied to the bandgap generator 210 by the control circuit 230 using the "trim" signals (e.g., trim_ref<K:0> and the rest). Specifically, each of the adjustable current outputs 215-218 may receive a calibration code from control circuit 230.

In this example, each of the adjustable current outputs 215-218 is coupled to a respective switch 235-238. Looking at adjustable current output 215 first, it is coupled to switch 235, which selectively couples adjustable current output 215 to an external ATE (not shown, receiving $V_O$) and to ADC 220. Control circuit 230 may control switch 235 so that the current from adjustable current output 215 may be provided to either the resistor load 250 or to ADC 220 at a given time.

Now looking at adjustable current outputs 216-218, they are coupled to switches 236-238. Switches 236-238 couple their respective adjustable current outputs 216-218 to either loads 240 or to ADC 220. Examples of loads are given above with respect to FIG. 1 and may include, e.g., LDOs, PLLs, and the like in SOC 100. During calibration, each of the switches 236-238 couples its respective adjustable current output 216-218 to the ADC 220 for measurement and calibration. During mission mode, those same switches 236-238 couple their respective adjustable current outputs 216-218 to loads 240. Loads 240 are shown collectively, and it is understood that each individual adjustable current output 216-218 may supply a reference current or voltage to different individual loads within SOC 100.

Looking at FIG. 3, it shows an example bandgap circuit architecture, according to one implementation. Specifically, FIG. 3 shows one way to implement the bandgap generator 210 of FIG. 2. For ease of illustration, FIG. 3 only shows the adjustable current output 215 and its switch 235 coupled to the resistor load, and it is understood that the other adjustable current outputs 216-218 and their switches 236-238 would be coupled as shown at FIG. 2.

Bandgap generator 210 is coupled to a voltage supply $V_{CC}$ at one end and ground at the other. Reference voltage output $V_O$ is positioned on a branch that receives current from the adjustable current output 215. The reference voltage level seen at $V_O$ depends on the current from the adjustable current output 215 and on the restive load parameters. In short, more current generates a higher voltage level at $V_O$ through the resistor load, and an external ATE (not shown) detects the level of $V_O$ for calibration of the first adjustable current output 215. The architecture shown in FIG. 3 is designed to be relatively stable throughout different temperature ranges and power supply voltage range, thereby providing a stable level at $V_O$ for a given calibration code. The other adjustable current outputs 216-218 are also designed to be relatively stable and, in fact, may be designed using the same transistors as in adjustable current output 215.

Figure 4:
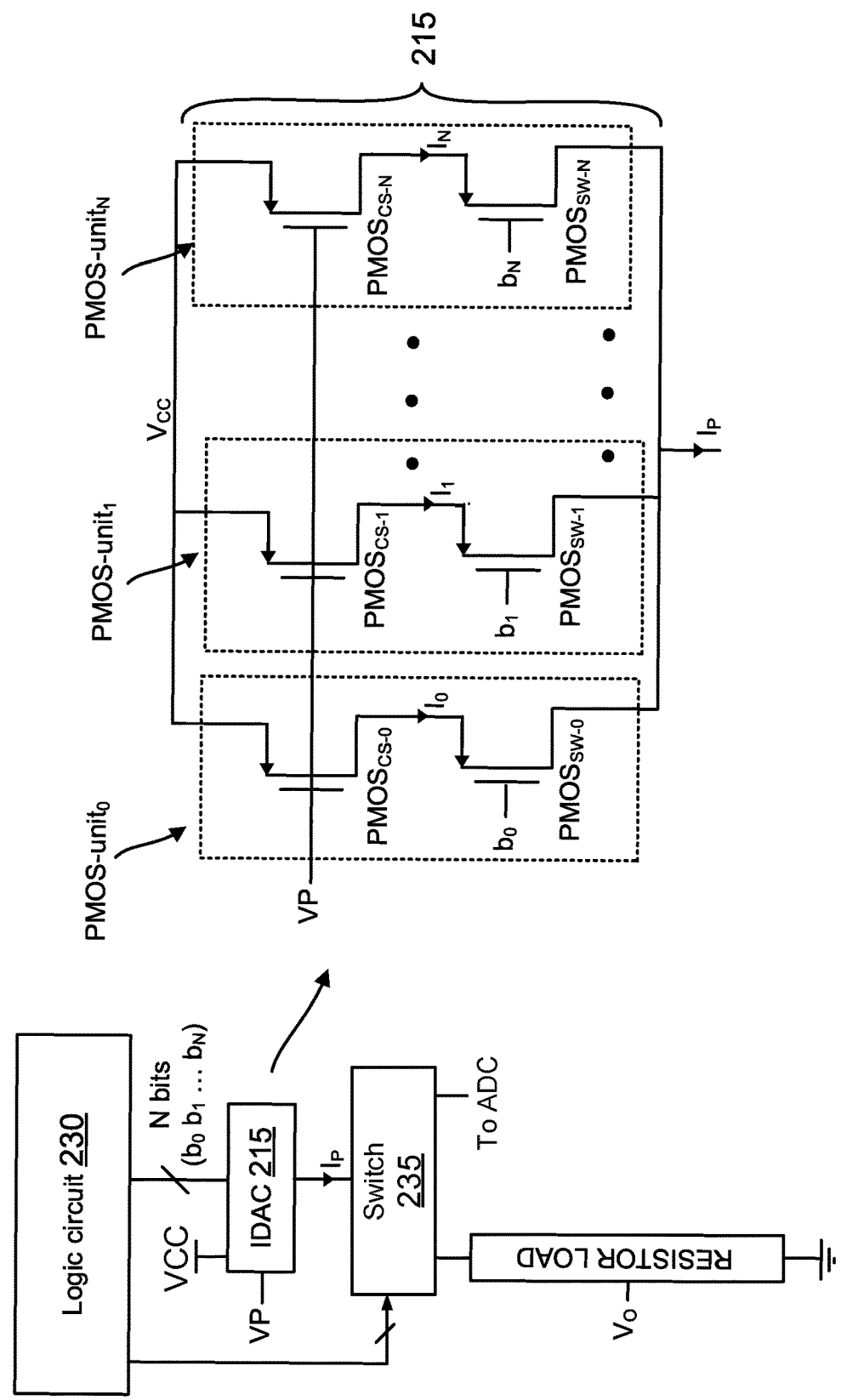
FIG. 4 is an illustration of an example adjustment circuit that may be used in the bandgap generator of FIG. 3, according to one implementation.

FIG. 4 is an illustration of an example adjustable current output 215, according to one implementation. The other adjustable current outputs 216-218 in this example may be structured the same as or similar to adjustable current output 215. In other words, an example structure is shown for adjustable current output 215, and it is understood that such structure may be used implement the other adjustable current outputs 216-218.

Adjustable current output 215 includes a plurality of PMOS unit cells, shown in this example as $PMOS_{unit0}$-$PMOS_{unitN}$, where N can be any appropriate integer so that the total number of PMOS units is greater than one. Each of the PMOS units includes at least one PMOS transistor that can be turned on or off, thereby transmitting current or preventing current from flowing. One example of such an implementation is shown in FIG. 4. Each PMOS unit can consist of a stack of two PMOS transistors. The first PMOS transistor $PMOS_{CS}$ can be used as a voltage-controlled current source with $V_P$ as control voltage. The second PMOS transistor $PMOS_{SW}$ can be turned on and off, thereby transmitting current or preventing current from flowing. The output current of a variable number of $PMOS_{units}$ are combined together to form a total current $I_p$. Other portions of the bandgap reference generator 210 are omitted for ease of illustration.

In one example, each of the transistors in the $PMOS_{units}$ are the same so that each unit is the same. In another example, each $PMOS_{unit}$ has a respective size so that a larger transistor $PMOS_{CS}$ may generate more current than a smaller transistor $PMOS_{CS}$. The transistors may be arranged from largest to smallest so that the largest of the transistors $PMOS_{CS}$ corresponds to a most significant bit and the smallest of the transistors corresponds to a least significant bit. Voltage adjustment circuit 215 is in communication with the logic circuit 230 to receive calibration codes at the $PMOS_{units}$ and, specifically, at the gate terminal of the transistors $PMOS_{SW}$. In this example, the calibration code is a digital binary code $b_0$ to $b_N$, and the $PMOS_{units}$ are configured as a current digital-to-analog converter (IDAC).

In this example, the $PMOS_{units}$ are arranged so that $PMOS_{units}$ receives a most significant bit and $PMOS_{unitM}$ receives a least significant bit of the calibration code. Thus, a binary 0 (digital low value) at a given leg will turn that unit on and allow current to flow through it, whereas a binary 1 (digital high value) at the same leg will turn that unit off and prevent current from flowing through it. In this manner, each calibration code corresponds to a particular current level. The current level of $I_{p-calibrated}$ is determined by the calibration code applied to the IDAC 215, and control circuit 230 may change the reference current level of $I_{p-calibrated}$ by changing the calibration code.

Of course, the scope of implementations is not limited to the particular current adjustment circuit architecture of FIG. 4. Rather, other implementations may use different kinds of transistors. For instance, an alternative implementation may use NMOS units, where each of the units is turned on by receiving a binary 1 at its gate and is turned off by receiving a binary 0 and its gate.

FIG. 4 also shows switch 235 coupled to control circuit 230 to receive control signals to adjust switch 235. Thus, control circuit 230 may adjust switch 235 to couple adjustable current output 215 to either the resistor load 250 or to ADC 220. The same is true for the other adjustable current outputs 216-218—their switches 236-238 are coupled in the same way to control circuit 230 to receive control signals therefrom.

Returning to FIG. 2, during a first phase of calibration, the adjustable current output 215 is calibrated using an external ATE (not shown). Switch 235 couples adjustable current output 215 to resistor load 250, and the external ATE measures a level of $V_O$ against a target voltage, which corresponds to a target current level of $I_{p\text{-}calibrated}$. The external ATE measures a difference between the level at $V_O$ and the target voltage level and may use control circuit 230 to adjust a calibration code at adjustable current output 215 so that adjustable current output 215 is set to the target current level. Once the first phase of calibration is complete, $I_{p\text{-}calibrated}$ is calibrated. The system may then move on to the second phase of calibration, which calibrates the adjustable current outputs 216-218.

Control circuit 230 adjusts switch 235 so that $I_{p\text{-}calibrated}$ provided to calibrated is ADC 220. ADC 220 generates a digital output representative of the level of the voltage at resistor load 250. In this example, ADC 220 acts as a voltmeter, though ADC 220 may be part of a larger embedded device, which may measure current, impedance, or other desired characteristics. In some examples, control circuit 230 may then adjust switch 235 so that $I_{p\text{-}calibrated}$ is once again provided to resistor load 250.

The control circuit 230 receives the digital output from the ADC and stores it for comparison. Control circuit 230 also applies the calibration code used at adjustable current generator 215 to the other adjustable current outputs 216-218. Depending on the amount of process variation and on the amount of mismatch between devices, ones of the adjustable current outputs 216-218 may produce a current with detectable difference when compared to $I_{p\text{-}calibrated}$.

Looking at adjustable current output 216 first, control circuit 230 controls switch 236 so that $I_{p\text{-}1}$ is provided to ADC 220. Once again, ADC 220 generates a digital output representative of the level of the voltage at $R_O$. Assuming that $I_{p\text{-}1}$ has a current level that is measurably different from that of $I_{p\text{-}calibrated}$, the digital output from ADC 220 may be different from the digital output resulting from $I_{p\text{-}calibrated}$. Control circuit 230 may calculate the error between the digital outputs and select a calibration code to set the current level of to that of $I_{p\text{-}calibrated}$ based on the error and known voltage level steps per calibration code steps. Control circuit 230 may then measure again to verify that the newly-applied calibration code causes the level of $I_{p\text{-}1}$ to match that of $I_{p\text{-}calibrated}$ and, if appropriate, apply a different calibration code and measure again.

Of course, the implementations are not limited to calculating a calibration code based on the error between the level of $I_{p\text{-}1}$ and $I_{p\text{-}calibrated}$. Rather, other implementations may iteratively adjust the calibration code to get the error to zero, which may include determining if the error is positive or negative and then stepping the calibration code in the appropriate direction to reach an error of approximately zero. Once the calibration code is determined for adjustable current output 216, control circuit 230 applies that calibration code to set adjustable current output 216 to the calibrated level (i.e., the level of $I_{p\text{-}calibrated}$).

Various implementations may format the output code of ADC 220 in any appropriate manner. For instance, some implementations may include any appropriate resolution (e.g., 4 bits or 16 bits) to indicate the resulting reference voltage level at $R_O$. In some implementations, the least significant bit of ADC 220 is smaller than the least significant bit of each current DAC of the adjustable current outputs 215-218. Such design limits the accuracy of the reference generator 190 to the DAC resolution. However, various implementations may design the resolutions of the ADC 220 and the current DACs in any appropriate way.

The control circuit 230 performs the same calibration process for adjustable current outputs 217 through 218. In other words, the control circuit 230 adjusts switch 237 to couple adjustable current output 217 to ADC 220 and performs a feedback loop measurement to determine a calibration code that corresponds to the voltage level of $I_{p\text{-}calibrated}$. The control circuit 230 repeats that process for each of the remaining adjustable output currents, so that at the end of the second phase of calibration, each of the adjustable current outputs 216-218 having associated currents $I_{p\text{-}1}$ through $I_{p\text{-}N}$ is set to a same current level as $I_{p\text{-}calibrated}$ (i.e., the target current level). As noted above, the number of adjustable current outputs can be any appropriate number (i.e., N can be any appropriate integer).

Once each of the adjustable current outputs 216-218 is calibrated to the target current level, the control circuit 230 may then adjust switches 236-238 so that each of the adjustable current outputs 216-218 is coupled to load 240. During regular operation of the SOC 100, each of the adjustable current outputs 260-218 is coupled to their respective loads within load 240. Of course, adjustable current outputs 216-218 may be calibrated so that their currents $I_{p\text{-}1}$ to $I_{p\text{-}N}$ match the target current level during any appropriate time, such as during manufacture, at boot up of the SOC 100, or during other appropriate times. Also, in some implementations calibration may be performed on one adjustable current output even while other adjustable current outputs are coupled to load 240. For instance, adjustable current output 236 may be coupled to load 240 while adjustable current output 237 is being calibrated.

The switches 235-238 perform a demultiplexing function within FIG. 2 so that a current input may be provided to a selected output. In some implementations, each switch includes two independent switches. Taking switch 235 as an example, a switch 235a on the left can close or open to connect or disconnect the adjustable current output 215 to the resistor load 250. Similarly, a switch 235b on the right can close or open to connect or disconnect the adjustable current output 215 to the ADC 220. The other switches 236-238 are implemented similarly. In other implementations, the switches 235-238 may be implemented as a switching network, where an example switching network according to one implementation is illustrated in FIG. 5.

Figure 5:
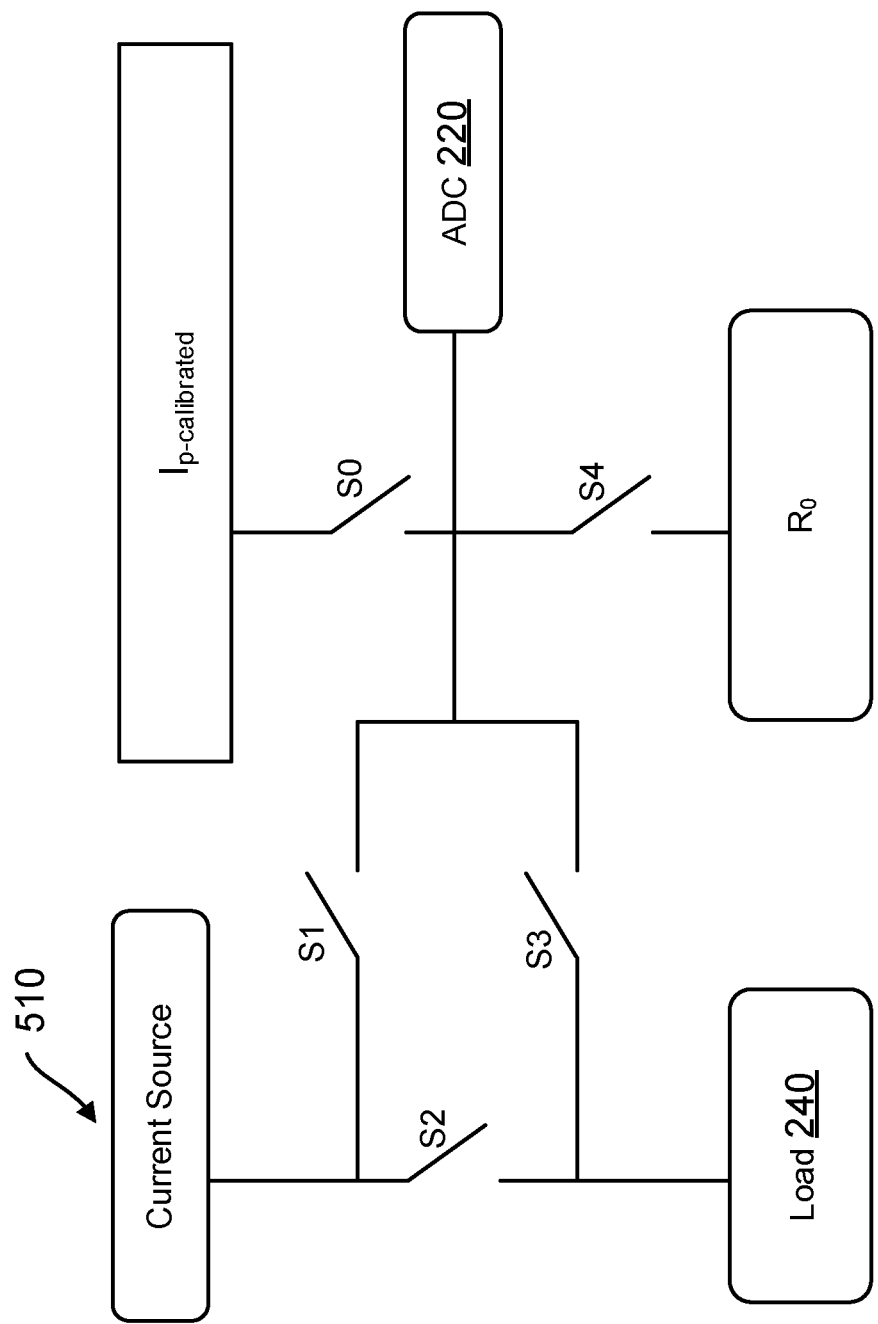
FIG. 5 is an illustration of an example switching network that may be used in a computing device, according to one implementation.

In the example of FIG. 5, current source 510 may be any one of currents through $I_{p\text{-}N}$. Load 240 may represent any one of the loads that would be individually present within load 240 of FIG. 2. Thus, any one of switches 236-238 may be implemented using S1 and S2 (or, alternatively, S2 and S3), and switch 235 may be implemented as S0 and S3 (or, alternatively, S0, S1, and S2). ADC 220, as noted above, may be implemented as part of a larger multimeter that is implemented within (or embedded within) the reference generator 190, which is configured to measure voltage, current, and impedance. In another example, S2 and S3 can be used to selectively couple current source 510 (e.g., any one of adjustable current sources 216-218) to either the ADC 220 or a load 240. Switch S4 is not shown in FIG. 2, but it is understood that it would be placed between ADC 220 and $R_O$.

Sometimes during operation, a load, represented here by load 240, may have a dynamic impedance, and that dynamic impedance may affect an output impedance of current source 510 or a current source within reference generator 190. In such cases, it may be desirable to adjust the performance of current source 510 and reference generator 190 to account for the dynamic impedance of load 240. The switching network of FIG. 5 provides the ability to measure impedance, among other things.

Now looking to FIG. 6, it is a chart showing a multitude of different measurements that can be performed using the current network of FIG. 5. For instance, in case 1a, only switch S1 is on, and this measures current of the current source 510. In case 1b, switches S0 and S4 are on to measure current of $I_{p\text{-}calibrated}$ using the ADC 220. In case 1b, switch 235 is implemented by S0.

In case 2, switches S1 and S2 are on, and ADC 220 measures voltage at load 240. In other words, S1 implements an aspect of any one of switches 236-238 by coupling a current source to a load 240. In another aspect, S1 and S2 together provide a connection not shown in FIG. 2 in which a voltage at the load 240 is measured by ADC 220. This is one example in which the switching network of FIG. 5 adds flexibility to the implementation of FIG. 2. In case 3, switch S4 is on, which measures impedance of the reference resistor $R_0$ (a reference load). As noted above, S4 is not shown in FIG. 2, but it is understood that it would be placed between ADC 220 and $R_0$. This is another example of the switching network of FIG. 5 adding flexibility (and functionality) to the implementation of FIG. 2. It should be noted, that in FIG. 2 $R_0$ is shown as a fixed resistance, though it may be implemented as an adjustable reference resistor in other implementations.

In case 4, switch S2 is on, which represents an active mode (a mission mode or normal operation) in which load 240 is supplied current by current source 510 and no measurements are being made. In case 4, S2 implements any one of switches 236-238 of FIG. 2 by selectively coupling a current source (e.g., any one of 216-218) to a load 240.

In case 5a, switches S1 and S4 are on, so that ADC 220 measures voltage at $R_0$. Case 5a provides one technique to calibrate one of the adjustable current sources 216-218. Specifically, switch S1 acts as any one switches 236-238 to selectively couple current source 510 (e.g., any one of 216-218 of FIG. 2) to load 240. In case 5b, switches S0 and S4 are on, thereby measuring voltage at $R_0$ resulting from $I_{p\text{-}calibrated}$. Case 5b implements the measuring action for $I_{p\text{-}calibrated}$ from FIG. 2, with switch S0 acting as switch 235 of FIG. 2.

In case 6, switch S3 is on, so that ADC 220 the impedance of load 240. In an instance in which the impedance of load 240 is expected to be dynamic, various implementations may perform an impedance measurement on load 240 periodically or at other appropriate times and then adjust $I_{p\text{-}calibrated}$ and current source 510 to account for the change in impedance at load 240. Measuring the impedance of load 240 is not depicted directly in FIG. 2, and this is another instance of the switching network of FIG. 5 adding flexibility and functionality to the implementation of FIG. 2.

Although not shown explicitly in FIG. 5, the switches S0-S4 may be controlled by control circuit 230. In other words, control circuit 230 may provide appropriate control signals to open or close any of switches S0-S4 according to a desired case of FIG. 6. For instance, control circuit 230 may include RTL hardware or firmware that provides the functionality described above and with respect to FIG. 7.

Various implementations may include one or more advantages over traditional systems. For instance, some traditional systems do not separately calibrate each of the adjustable current outputs, instead, calibrating only one adjustable current output and applying the same calibration code to the remaining adjustable current outputs. However, measurements of such traditional systems indicate that some of the adjustable current outputs may show an error of up to plus or minus 4%. Such error may be acceptable for some applications, but it may be unacceptable for other applications requiring more precise reference currents and voltages.

By contrast, various implementations provide calibration of each of the adjustable current outputs independently. Such independent calibration may allow for more precision in each of the adjustable current sources reducing the error to a lowest amount provided by a least significant bit of the calibration codes. Some implementations may include a least significant bit of the calibration codes small enough that error does not affect performance of loads. Such increased precision of reference currents and voltages may allow for faster operation of loads under a variety of operating conditions, such as temperature.

Also, since various implementations are not limited to performing calibration of $I_{p\text{-}1}$ through $I_{p\text{-}N}$ during manufacture, calibration may be performed at any appropriate time, such as at boot up of the chip, at periodic time intervals, and/or the like. Accordingly, various implementations may perform calibration that is appropriate for a particular chip age, operating condition, and load impedance so that precise reference current and voltage levels are achieved.

Also, various implementations may achieve the increased precision for the reference currents and voltages without increasing use of external ATE for bandgap generator calibration. For example, it is generally expected that external ATE time may be valuable and is typically only available during manufacture. By contrast, various implementations perform calibration of $I_{p\text{-}1}$ through $I_{p\text{-}N}$ using an ADC on the chip itself so that external ATE time may be unneeded, at least for those reference currents. Nevertheless, the scope of implementations does not prohibit the use of external ATE for either bandgap calibration or other uses.

Figure 7:
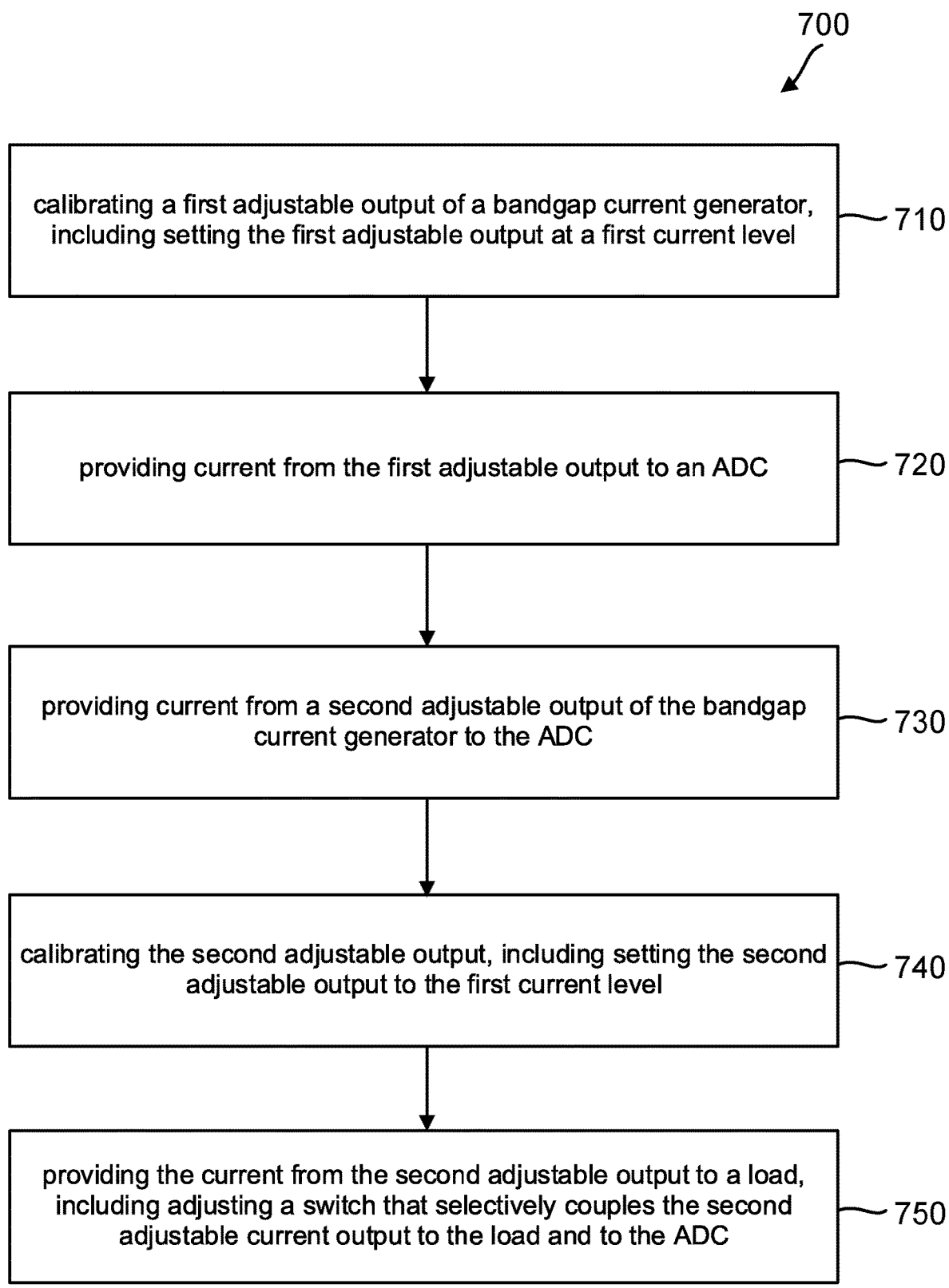
FIG. 7 is an illustration of a flow diagram of an example method of calibrating a bandgap generator, according to one implementation.
Figure 8:
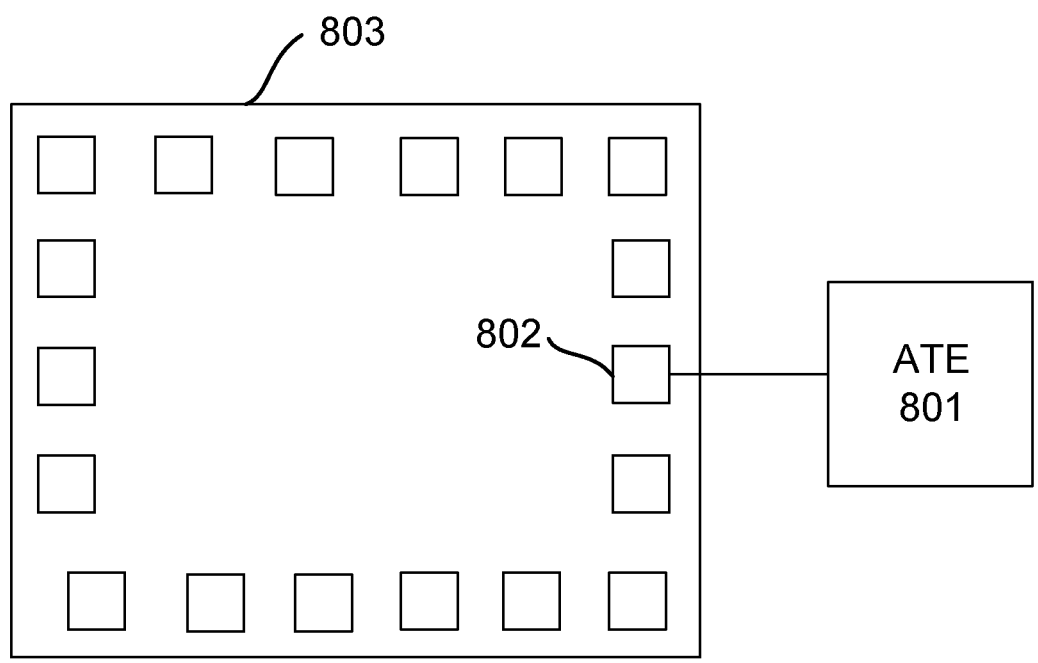
FIG. 8 is an illustration of a system using an external ATE, according to one implementation.

A flow diagram of an example method 700 for calibrating a bandgap reference generator is illustrated in FIG. 7. In one example, method 700 is performed by reference generator 190 of FIG. 2. Hardware or software logic, such as control circuit 230 of FIG. 2 may perform calculations and apply a calibration code to an adjustable current output. In the example of FIG. 2, the control circuit 230 may be implemented using RTL, though in other implementations the functionality of control circuit 230 may be implemented by processing circuitry that executes firmware or software code stored to a computer-readable medium.

At action 710, the control circuit 230 calibrates the first adjustable output of a bandgap generator. Action 710 may include setting the first adjustable output at a first current level. In the example of FIG. 2, control circuit 230 calibrates a first adjustable current output 215 of the bandgap current generator 210. The control circuit 230 performs the calibration using an external calibration circuit (e.g., an ATE) and applies a calibration code to adjustable current output 215 to set $I_{p\text{-}calibrated}$ to a target current level. The calibration code may be stored in any appropriate manner, including in a register, a set of fuses, or the like. Action 710 may also include applying that same calibration code to other adjustable outputs. In some examples, each of the adjustable current outputs may include a DAC, and calibration codes may be applied to the DACs.

At action 710, the current may pass through a first switch (e.g., switch 235) that selectively couples the first adjustable output (e.g., 215) to either the ATE or an ADC at a given time. During action 710, the switch selectively couples the first adjustable output to the ATE.

At action 720, current from the first adjustable output is provided to the ADC. For instance, action 720 may include adjusting the switch associated with the first adjustable output so that the switch selectively couples a first adjustable output to the ADC. The switch may be controlled, e.g., by control circuit 230.

Action 720 may further include the ADC measuring the current level of $I_{p\text{-}calibrated}$ and outputting a digital code indicative of that current level. In some example implementations, control circuit 230 receives that digital code from the ADC and stores that digital code so that other current levels may be compared against $I_{p\text{-}calibrated}$.

At action 730, current from a second adjustable output (e.g., any one of adjustable current outputs 216-218) is provided to the ADC. An example is shown in FIG. 2 in which switch 236 couples adjustable current output 216 to ADC 220.

At action 740, control circuit 230 calibrates a second adjustable output. For instance, the control circuit 230 may compare a digital output of the ADC responsive to the current from the second adjustable output and compare that digital output to the digital output associated with observed level of $I_{p\text{-}calibrated}$. The difference between the two digital outputs from the ADC is an error, and the calibration technique may minimize that error within a level of precision provided by the calibration codes. In one example, the control circuit 230 calculates the error and determines an appropriate calibration code by using a relationship between calibration code steps and corresponding voltage changes with each calibration code step. In other examples, the control circuit 230 may calculate the error and iteratively apply calibration codes, stepping through the calibration codes until the error is zero or is otherwise minimized to a level allowed by the resolution of the calibration codes.

Action 740 may further include setting the second adjustable output to the first current level, such as by applying a calibration code to the second adjustable output so that the first adjustable output also matches the target current level.

At action 750, current from the second adjustable output is provided to a load. Action 750 may include adjusting a second switch (e.g., any one of 216-218) that selectively couples a second adjustable current output to the load and to the ADC. At action 740, the switch may couple the second adjustable output to the ADC, where as in action 750, the switch may couple the second adjustable output to the load. In the example of FIG. 2, control circuit 230 may control switch 236 so that the current from adjustable output 216 is directed to either the load 240 or to the ADC 220.

The scope of implementations is not limited to the actions shown in FIG. 7. Rather, various implementations may add, omit, rearrange, or modify various actions. For instance, some implementations may include repeating the calibration as temperature changes, at periodic times, or at other appropriate instances to ensure precise calibration. In fact, the calibration technique may be performed at manufacture, during mission mode, or at any other appropriate time.

Furthermore, various implementations may include actions that are associated with the switching network shown in FIG. 5 and further described at FIG. 6. For instance, the control circuit 230 may control the switches S0-S4 to provide normal operating mode or some other measurement, such as set out in cases 1a-6 of FIG. 6. Examples may include adjusting one or more switches to couple the load to the ADC, measuring an impedance of the load, and adjusting the adjustable current sources if appropriate in response to a dynamic impedance of the load. Another example includes adjusting another switch to couple the reference resistor to the ADC, such as by turning on switch S4 of FIG. 5. Coupling the reference resistor to the ADC may allow the ADC to measure a voltage associated with a current. In fact, the scope of implementations includes method 700 providing for any of the cases listed in FIG. 6 by controlling switches and making appropriate measurements by the ADC.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A computing chip comprising:
a bandgap current generator;
a first adjustable current output coupled to the bandgap current generator;
a second adjustable current output coupled to the bandgap current generator;
a first switch configured to selectively couple the first adjustable current output to an external device and to a first analog-to-digital converter (ADC) on the computing chip; and
a second switch configured to selectively couple the second adjustable current output to a load on the computing chip and to the ADC.

2. The computing chip of claim 1, wherein the load on the computing chip comprises a second analog-to-digital converter (ADC).

3. The computing chip of claim 1, wherein the load on the computing chip comprises a low drop out (LDO) voltage regulator.

4. The computing chip of claim 1, further comprising a feedback loop from the first ADC to the second adjustable current output.

5. The computing chip of claim 1, wherein the first adjustable current output comprises a current digital-to-analog converter (DAC).

6. The computing chip of claim 1, further comprising:
a third switch configured to selectively couple the first ADC to a reference load.

7. The computing chip of claim 1, wherein the second switch comprises a switching network having a third switch coupling the second adjustable current output to the load on the computing chip and a fourth switch coupling the second adjustable current output to the first ADC.

8. The computing chip of claim 1, wherein the first ADC comprises an embedded multimeter.

9. The computing chip of claim 1, further comprising a feedback loop including:
a control circuit configured to receive an output of the ADC and apply a digital code to the second adjustable current output.

10. The computing chip of claim 1, further comprising a feedback loop including:
a control circuit configured to:
receive an output of the ADC, calculate a difference between the output of the ADC and a reference value from the first adjustable current output, and apply a digital code to the second adjustable current output based at least in part on the difference between the output of the ADC and the reference value.

11. The computing chip of claim 1, wherein the first adjustable current output comprises a plurality of parallel transistors, each of the transistors having a gate configured to receive a digital high or low value.

12. The computing chip of claim 1, wherein the second adjustable current output comprises a plurality of parallel transistors, each of the transistors having a gate configured to receive a digital high or low value.

13. A method comprising:
calibrating a first adjustable output of a bandgap current generator, including setting the first adjustable output at a first current level;
adjusting a first switch that is configured to selectively couple the first adjustable output to an analog-to-digital converter (ADC);
providing current from the first adjustable output to the ADC;
providing current from a second adjustable output of the bandgap current generator to the ADC;
calibrating the second adjustable output, including setting the second adjustable output to the first current level; and
adjusting a second switch that is configured to selectively couple the second adjustable output to a load and to the ADC.

14. The method of claim 13, wherein the first adjustable output comprises a current digital-to-analog converter (DAC), and wherein setting the first adjustable output at the first current level comprises applying a calibration code to the current DAC.

15. The method of claim 13, wherein setting the first adjustable output at the first current level comprises determining a calibration code that corresponds to the first adjustable output.

16. The method of claim 15, wherein determining the calibration code comprises iteratively applying a plurality of calibration code steps to achieve the first current level.

17. The method of claim 15, wherein determining the calibration code comprises calculating an error between an observed current level of the first adjustable output and the first current level.

18. The method of claim 13, wherein the first switch is configured to selectively couple the first adjustable output to the ADC and to an external automated test equipment.

19. The method of claim 13, further comprising:
adjusting a third switch to couple the load to the ADC; and
measuring an impedance of the load.

20. The method of claim 13, further comprising:
adjusting a third switch to couple a reference resistor to the ADC.

21. A system on chip (SOC) comprising:
means for generating a plurality of reference current levels in response to a plurality of calibration codes;
means for providing a first adjustable current from the generating means;
means for providing a second adjustable current from the generating means;
means for selectively coupling the first adjustable current to an an external device and to a first analog-to-digital converter (ADC) on the SOC; and
means for selectively coupling the second adjustable current to a load on the SOC and to the ADC.

22. The SOC of claim 21, further comprising means for calibrating the first adjustable current to a target current level and for calibrating the second adjustable current to the target current level.

23. The SOC of claim 21, wherein the means for selectively coupling the first adjustable current to the external device and to the first ADC comprises a first switch, the SOC further comprising means to adjust the first switch after calibrating the first adjustable current to a target current level.

24. The SOC of claim 21, wherein the means for selectively coupling the second adjustable current to the load and to the ADC comprises a first switch, the SOC further comprising means to adjust the first switch after calibrating the second adjustable current to a target current level.

25. The SOC of claim 21, wherein the means for selectively coupling the second adjustable current to the load and to the ADC comprises a switching network having a first switch coupling the second adjustable current to the load and a second switch coupling the second adjustable current to the ADC.

26. A system on chip (SOC) comprising:
a bandgap current generator;
a first digital-to-analog converter (DAC) coupled to the bandgap current generator;
a second DAC coupled to the bandgap current generator;
a first switch configured to selectively couple the first DAC to an external device and to a first analog-to-digital converter (ADC) on the SOC; and
a second switch configured to selectively couple the second DAC to a load on the SOC and to the ADC.

27. The SOC of claim 26, wherein the second switch comprises a switching network having a third switch coupling the second DAC to the load and a fourth switch coupling the second DAC to the first ADC.

\* \* \* \* \*